(12) United States Patent
Fornes et al.

(10) Patent No.: US 7,968,624 B2
(45) Date of Patent: Jun. 28, 2011

(54) HIGHLY FILLED POLYMER MATERIALS

(75) Inventors: Timothy D. Fornes, Apex, NC (US); Nicolas D. Huffman, Raleigh, NC (US)

(73) Assignee: LORD Corporation, Cary, NC (US)

( * ) Notice: Subject to any disclaimer, the term of this patent is extended or adjusted under 35 U.S.C. 154(b) by 621 days.

(21) Appl. No.: 11/876,880

(22) Filed: Oct. 23, 2007

(65) Prior Publication Data

US 2008/0111111 A1    May 15, 2008

Related U.S. Application Data

(60) Provisional application No. 60/862,463, filed on Oct. 23, 2006.

(51) Int. Cl.
*C08K 9/00* (2006.01)
*C08L 83/04* (2006.01)

(52) U.S. Cl. .................. 523/200; 523/220; 524/588

(58) Field of Classification Search .................. 523/200, 523/220; 524/588
See application file for complete search history.

(56) References Cited

U.S. PATENT DOCUMENTS

| | | | |
|---|---|---|---|
| 3,547,871 A | 12/1970 | Hofman | |
| 4,080,353 A * | 3/1978 | Monte et al. ................ | 523/202 |
| 4,214,121 A | 7/1980 | Charneski et al. | |
| 4,312,793 A | 1/1982 | Charneski et al. | |
| 5,041,242 A | 8/1991 | Fowle et al. | |
| 5,430,330 A | 7/1995 | Takahama et al. | |
| 5,447,564 A | 9/1995 | Xie et al. | |
| 5,545,473 A * | 8/1996 | Ameen et al. ................ | 428/212 |
| 5,880,195 A | 3/1999 | Kalinowski et al. | |
| 5,976,628 A | 11/1999 | Kawahara et al. | |
| 6,040,277 A | 3/2000 | Caporiccio | |
| 6,040,362 A * | 3/2000 | Mine et al. ................ | 523/212 |
| 6,174,841 B1 | 1/2001 | Yamada et al. | |
| 6,255,257 B1 | 7/2001 | Yamada et al. | |
| 6,361,716 B1 * | 3/2002 | Kleyer et al. ................ | 252/514 |
| 6,368,704 B1 | 4/2002 | Murata et al. | |
| 6,372,337 B2 | 4/2002 | Takahashi et al. | |
| 6,589,918 B2 | 7/2003 | Denpo et al. | |
| 6,632,780 B2 | 10/2003 | Uematsu et al. | |
| 6,689,721 B2 | 2/2004 | Denpo et al. | |
| 6,818,600 B2 | 11/2004 | Yamada et al. | |
| 7,049,223 B2 | 5/2006 | Sasaki et al. | |
| 7,396,872 B2 | 7/2008 | Sekiba | |
| 7,504,453 B2 | 3/2009 | Hu et al. | |
| 2002/0018885 A1 | 2/2002 | Takahashi et al. | |
| 2004/0043596 A1 | 3/2004 | Sasaki et al. | |
| 2004/0097628 A1 | 5/2004 | Sekiba | |
| 2005/0045855 A1 | 3/2005 | Tonapi et al. | |
| 2005/0085578 A1 | 4/2005 | Iguchi | |
| 2005/0171269 A1 | 8/2005 | Hu et al. | |
| 2005/0172483 A1 | 8/2005 | Sugita et al. | |
| 2007/0131912 A1 | 6/2007 | Simone et al. | |

FOREIGN PATENT DOCUMENTS

| | | |
|---|---|---|
| EP | 0060621 A3 | 9/1982 |
| EP | 0292231 A | 11/1988 |
| EP | 0379773 A1 | 8/1990 |
| EP | 0389899 A | 10/1990 |
| EP | 0575889 A2 | 12/1993 |
| EP | 0575889 A3 | 12/1993 |
| EP | 0373400 B1 | 2/1996 |
| EP | 0779773 A1 | 6/1997 |
| EP | 0779773 B1 | 6/1997 |
| EP | 0745061 B1 | 4/1999 |
| EP | 0982392 A1 | 3/2000 |
| EP | 0982392 B1 | 3/2000 |
| JP | 01294784 A | 11/1989 |
| JP | 06215617 A | 8/1994 |
| JP | 08055514 A | 2/1996 |
| WO | WO9522511 | 8/1995 |
| WO | WO03106600 A1 | 12/2003 |

OTHER PUBLICATIONS

Elliott et al., "Recursive Packing of Dense Particle Mixtures", Journal of Materials Science Letters, vol. 21, 2002, pp. 1249-1251.
Bae et al., "The Properties of AlN-Filled Epoxy Molding Compounds by the Effects of Filler Size Distribution", Journal of Materials Science, vol. 35, 2000, 5907-5913.
Ye et al., "Effect of Ag Particle Size on Electrical Conductivity of Isotropically Conductive Adhesives", IEEE Transactions on Electronics Packaging Manufacturing, vol. 22, No. 4, Oct. 1999, pp. 299-302.
Lilei Ye, Zonghe Lai, Johan Liu, and Anders Tholen, Effect of Ag Particle Size on Electrical Conductivity of Isotropically Conductive Adhesives, IEEE Transactions on Electronics Packaging Manufacturing, Oct. 1999, vol. 22, No. 4, pp. 299-302.

* cited by examiner

*Primary Examiner* — Vickey Nerangis
(74) *Attorney, Agent, or Firm* — Todd W. Galinski

(57) ABSTRACT

A highly filled system is provided which employs the combination of coated filler particles and a compatibilizer to allow extremely high filler loading while maintaining a low viscosity. The compositions of the present invention allows a filler level which was previously unachievable due to the increase in viscosity which is particularly evident when extremely small (nanometer sized) filler is added to a system containing conventional (micron sized) filler particles. This is accomplished through selection of a coating for the filler and selection of a compatibilizer which improves the affinity between the filler and the polymer, thereby improving nanometer sized filler wetting and dispersion and allowing the filler to be incorporated into the polymer matrix.

25 Claims, 4 Drawing Sheets

HIGHLY FILLED POLYMER MATERIALS

CROSS REFERENCE TO RELATED APPLICATIONS

The present application claims priority under 35 U.S.C. §119(e) from U.S. Provisional Patent Application Ser. No. 60/862,463, filed Oct. 23, 2006 entitled "THERMAL INTERFACE MATERIALS BASED ON DENSE RECURSIVE PACKING OF MICRON AND NANOMETER SIZED FILLERS", the disclosure of which is incorporated herein by reference.

FIELD OF THE INVENTION

The present invention relates to a highly filled material employing a coated filler and a compatibilizer in a polymer base which allows optimal filler loading while maintaining a low viscosity. More particularly, the present invention relates to a highly-filled low viscosity material useful for applications such as thermal interface materials in electronics packaging, and other thermally or electrically conductive compositions.

BACKGROUND OF THE INVENTION

Electronic components generate heat while they are used and the removal of this heat is necessary to prevent thermal destruction of the component and improve operating efficiency. For microelectronic components such as integrated circuits, thermally conductive materials such as thermally conductive greases, gels, or adhesives are provided to help remove heat from the component.

In general, microelectronic devices comprise integrated circuits protected within a housing or packaging, and a thermally conductive material applied so as to contact directly with both the integrated circuit element and the external packaging or a heat sink if one is provided. The heat generated from the integrated circuit chips during operation is transmitted through the thermally conductive material away from the device, and further radiated therefrom.

For example, U.S. Pat. No. 6,255,257 entitled "SILICONE GREASE COMPOSITION" relates to a silicone grease composition having high thermal conductivity, comprising (A) 50 to 95 weight percent of a mixture of an aluminum nitride powder having an average particle size of 0.5 to 5 microns and an aluminum nitride powder having an average particle size of 6 to 20 microns, (B) 5 to 15 weight percent of organopolysiloxanes having a viscosity of from 50 to 50,000 cs at 25° C. and (C) 0 to 35 weight percent of at least one inorganic compound powder having an average particle size of 0.5 to 100 microns selected from the group consisting of zinc oxide, alumina, boron nitride and silicon carbide powders.

These prior art systems are somewhat limited in that the thermal conductivity of the material is most closely related to the amount of thermally conductive filler in the material. As more filler material is added, the thermal conductivity increases. Unfortunately, as more filler is added, the viscosity of the resulting material also increases. The balance between achieving a high thermal conductivity through high filler loading while maintaining a workable viscosity is often an undesirable trade-off. Many of these materials are dispensed with a syringe and therefore the viscosity must remain low enough to allow flow through a needle.

It is therefore commercially desirable to provide a material with a high filler loading while maintaining a working viscosity. It would further be desirable to provide a highly filled, low viscosity thermally conductive material which is needle dispensable.

SUMMARY OF THE INVENTION

The present invention provides a highly filled system which employs the combination of coated filler particles and a compatibilizer to allow extremely high filler loading while maintaining a low viscosity. The composition of the present invention allows a filler level which was previously unachievable due to the increase in viscosity which is particularly evident when extremely small (nanometer sized) filler is added to a system containing conventional (micron sized) filler particles.

The formulations of the present invention overcome the problem of incorporating high amounts of filler into a polymer matrix through the use of a carefully selected coating for the filler and selection of a compatibilizer, which improves the affinity between the filler and the polymer, thereby improving nanometer sized filler wetting and dispersion and allowing the filler to be incorporated into the polymer matrix.

In a first aspect of the present invention, a composition is provided comprising a polymer base, at least 70 volume percent of a filler comprising a mixture of micron sized particles and nanometer sized particles, the filler exhibiting a packing efficiency of at least 80%, and said filler coated with a functional coating, and a compatibilizer which is soluble in the polymer base and comprising at least one functional moiety which interacts with the functional coating on the filler to enhance the affinity between the filler and the polymer base.

In one embodiment of the present invention, the viscosity is less than 600 Pa-s at room temperature and a shear rate of 10 s−1. In another embodiment of the present invention, the packing efficiency is at least 80%, and in still another embodiment of the present invention, the packing efficiency is at least 90%.

In a further embodiment of the present invention, the polymer base comprises epoxy. And in a preferred embodiment of the present invention, the polymer base comprises a polysiloxane fluid. In a still further preferred embodiment of the present invention, the polysiloxane fluid comprises polydimethylsiloxane.

In one embodiment of the present invention, the functional coating comprises a carboxcylic acid coating.

In one embodiment of the present invention, the compatibilizer comprises a monocarbinol terminated polymer. In another embodiment of the present invention, the compatibilizer comprises monocarbinol terminated polydimethylsiloxane. In still another embodiment of the present invention, the compatibilizer comprises a molecular weight of at least about 500. in yet a futher embodiment of the present invention, the compatibilizer comprises a functionalized polyer comprising a molecular weight of between about 5,000 and about 10,000.

In one embodiment of the present invention, at least one of the nanometer sized partical and the micron sized particals are thermally conductive. In another embodiment of the present invention, at least one of the nanometer sized partical and the micron sized particals are electrically conductive.

In a preferred embodiment of the present invention, the nanometer sized filler comprises at least one of aluminum and zinc oxide. In another preferred embodiment of the present invention, the micron sized filler comprises at least one of aluminum or zinc oxide.

In one embodiment of the present invention, the micron sized particles has an average particle diameter of 1 to 20 microns. In another embodiment of the present invention, the micron sized particles has an average particle diameter of about 9 microns. In a futher embodiment of the present invention, the nanometer sized particals has an average partical of 1 to 200 nanometers. In yet another embodiment of the present invention, the nanometer sized particals has an average particle diameter of 20 to 120 nanometers. In still another embodiment of the present invention, the nanometer sized paticals have an average partical diameter of about 100 nanometers.

In an additional embodiment of the present invention, the ratio of average partical diameter of the first group of particals to the average partical diameter of the second group of the particals comprises at least 70:1.

In a second aspect of the present invention, a thermally conductive composition is provided comprising at least 70:1.

In a second aspect of the present invention, a thermally conductive composition is provided comprising a polymer base, a filler comprising at least two distinct particle size distributions wherein the smaller particle is coated with a functional coating, and a compatibilizer having a molecular weight of at least about 1000 and having one functional moiety which interacts with the functional coating and wherein the compatibilizer is soluble in the polymer base.

In one embodiment of the present invention, the composition further comprises a third particle size distribution having an average particle diameter different from both of the at least two distinct particle size distributions.

In a third aspect of the present invention, a method for forming a highly filled thermally conductive composition is provided comprising, selecting a thermally conductive filler, coating the filler with a functional coating, selecting a polymer base, selecting a compatibilizer which is soluble in the polymer base and comprising at least one functional moiety which interacts with the functional coating on the filler, and adding the coated filler and the compatibilizer to the polymer base to achieve a total filler loading of at least 70 volume percent and a viscosity of less than 600 Pa-s at room temperature and a shear rate of 10 s−1.

Thus, there has been outlined, rather broadly, the more important features of the invention in order that the detailed description that follows may be better understood and in order that the present contribution to the art may be better appreciated. There are, obviously, additional features of the invention that will be described hereinafter and which will form the subject matter of the claims appended hereto. In this respect, before explaining several embodiments of the invention in detail, it is to be understood that the invention is not limited in its application to the details and construction and to the arrangement of the components set forth in the following description or illustrated in the drawings. The invention is capable of other embodiments and of being practiced and carried out in various ways.

It is also to be understood that the phraseology and terminology herein are for the purposes of description and should not be regarded as limiting in any respect. Those skilled in the art will appreciate the concepts upon which this disclosure is based and that it may readily be utilized as the basis for designating other structures, methods and systems for carrying out the several purposes of this development. It is important that the claims be regarded as including such equivalent constructions insofar as they do not depart from the spirit and scope of the present invention.

DETAILED DESCRIPTION OF THE INVENTION

Figure 1:
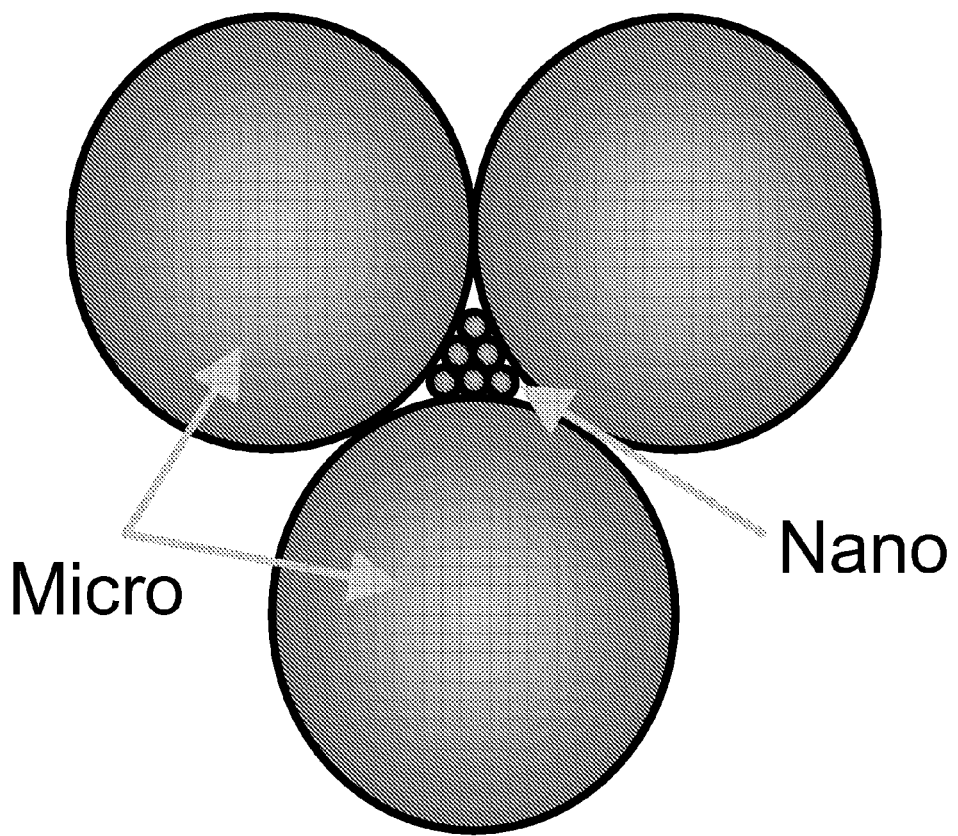
FIG. 1 Illustrates an embodiment of the present invention comprising the theoretically idealized structure of a recursively packed binary filler mixture comprising micron and nanometer sized filler particles.

In a first aspect of the present invention, a composition is provided comprising a polymer base, a filler comprising a mixture of micron sized particles and nanometer sized particles, a functional coating on at least the nanometer sized filler, and a compatibilizer which is soluble in the polymer base and comprises at least one functional moiety which interacts with the functional coating on the filler to enhance the affinity between the filler and the polymer base.

In a preferred embodiment of the present invention, the filler is incorporated into a polymer base. In an embodiment of the present invention comprising a filled grease composition, the polymer base preferably comprises a low molecular weight organopolysiloxane material such as phenylmethylsiloxane, diphenylmethylsiloxane, polydiethylsiloxanes and its copolymers, organopolysiloxanes such as acyclic aliphatic, cyclic aliphatic, and aromatic modified siloxanes, and combinations thereof, specific examples include polyoctylmethylsiloxane, dicyclopentylsiloxane, (ethylmethylsiloxane)-(phenylpropylmethylsiloxane) copolymer and the like; copolymers of the above-listed compounds; fluorosilicones; and PDMS—polyethyleneoxide copolymers. In a most preferred embodiment of the present invention, the low molecular weight polymer comprises polydimethylsiloxane (PDMS) fluid.

Other silicone fluids suitable for use in embodiments of the present invention include silicones having reactive functional groups either pendent to or at the end of the siloxane polymer backbone, e.g. epoxidies, amines, hydride, vinyl, hydroxyl, isocyanate, mercapto, carbinol, etc., vinyl functional silicones having vinyl terminated functionality and/or vinyl groups pendent from the siloxane backbone; siloxane backbones can consist of silicone fluids listed above; vinyl T-structure polymers; hydride functional polymers having hydride terminated and/or hydride groups pendent from the siloxane backbone; siloxane backbones can consist of silicone fluids listed above.

In another embodiment of the present invention, the polymer base comprises compounds of the following type: diglycidal ethers of bishpenol A, acrylates, urethanes, esters, ethers, olefins, amines, amides, and copolymers thereof. In a still further embodiment of the present invention, the polymer base comprises reactive monomers which polymerize in the composition to form a polymer base in the final product.

The filler employed in the present invention comprises at least two distinct particle size groups. The first group comprises micron sized particles having an average particle diameter of about 1 to about 20 microns and the second group comprises nanometer sized particles having an average diameter of about 1 to about 200 nanometers. In another embodiment of the present invention, the large particles have an average diameter in the range of 5 to 15 microns. In a further embodiment of the present invention, the small particles have an average diameter in the range of 20 to 120 nanometers. In a most preferred embodiment of the present invention, the small particles have an average particle diameter of about 100 nanometers.

Perhaps more important that absolute particle size is the ratio of micron sized particle diameter to nanometer sized particle diameter. In order to achieve a truly recursively packed structure, as illustrated in FIG. 1, the large particles must be at least 10 times bigger than the small particles in an ideal case where the large and small particles are each monodispersed in size. In reality, the large and small groups of particles each comprise a distribution of particle diameters. To account for such a distribution while maintaining efficient packing the ratio of mean particle diameters of the large to small groups must be significantly greater than 10. The packing efficiency generally increases as the ratio of large particle diameter to small particle diameter increases, then plateaus at ratios above about 70. In one embodiment of the present invention, the ratio of the average micron particle diameter to average nanometer particle diameter comprises at least 41:1. In another embodiment of the present invention, the ratio of the average micron particle diameter to average nanometer particle diameter comprises at least 70:1.

In a further embodiment of the present invention, the filler material comprises a solid material with a thermal conductivity greater than that of the matrix material. Suitable filler materials for use in embodiments of the present invention include, metallic fillers such as aluminum, silver, copper, nickel, iron, cobalt, and combinations thereof e.g. silver-coated copper, silver-coated nickel; metal oxides or nitrides such as aluminum oxide (alumina), zinc oxide, or aluminum nitride; and other known thermally conductive filler such as boron nitride, silicon nitride, magnesium oxide, silicon carbide, carbon black, carbon fullerenes, graphite flake, carbon nanotubes, carbon nanofibers.

Though it should be noted that the optimal packing discussed herein applies to spherical materials and boron nitride, graphite flake, carbon nanotubes and carbon nanofibers are not spherical. It should also be noted, that spherical (zero-dimensional) fillers, having the lowest surface area to volume ratio of filler particles, typically contribute to a less pronounced increase in viscosity at low shear rates when dispersed in polymers as compared to one-dimensional (e.g. fibers) and two-dimensional (e.g. platelets) fillers.

In a further embodiment of the present invention, the filler is coated with a functional coating. The functional coating allows the filler to interact with a compatibilizer to improve the affinity between the filler and the polymer base thereby increasing the total amount of filler present in the composition while maintaining an acceptable viscosity. In one preferred embodiment of the present invention, the filler coating comprises unsaturated or saturated fatty acids and derivatives thereof including ionic soaps or salts thereof, alkanoic and alkenoic acids and derivatives thereof including ionic soaps or salts, alenoic acid, alkylester-acid, organosilane, organotitaninate, organozirconates, isocyanates, polymeric grafts of functionalized polymers and copolymers, hydroxyl terminated alkenes and alkanes. In another preferred embodiment of the present invention, the coating comprises an unsaturated fatty acid having a chain length of $C_3$ to $C_{24}$. In yet another preferred embodiment of the present invention the filler coating comprises at least one of, propionic acid, lauric acid, palmitic acid, and stearic acid.

In one embodiment of the present invention, the composition comprises a compatibilizer which has a functionality that interacts with the coating on the filler and another functionality that renders the compatibilizer soluble in the polymer base. Compatibilizer material primarily acts to aid in incorporating high filler concentrations in the polymer base by interacting with the coating on the filler and improving the affinity between the filler and the polymer base. This results in improved filler dispersion, composite viscosity, and/or thermal conductivity, and/or electrical conductivity.

In one embodiment of the present invention comprising a silicone polymeric base as the polymer base, suitable compatibilizers include functionalized silicones such as those having end functionality (including monofunctional versions) and functional groups pendent from the siloxane backbone. Functional groups can consist of the following types: silanol, carbinol, amine, epoxy, acrylate, methacrylate, carboxylate; and siloxane backbones can consist of silicone fluids listed above. Other materials suitable for use include organosilanes, organotitanates, and organozirconates. In certain cases, these functional materials may be reactive and thus form permanent crosslinks within the polymer matrix.

In a preferred embodiment of the present invention wherein the polymer base comprises polydimethylsiloxane (PDMS), the compatibilizer comprises a monofunctional carbinol terminated polydimethylsiloxane.

While unexpected, it has been discovered that high molecular weight compatibilizers, i.e. those having molecular weights in excess of that of the polymer base, result in lower viscosities in the final composition than compatibilizers having molecular weights lower than the polymer base. Additionally, it has been discovered that below a certain molecular weight there is little effect of additional compatibilizer on the viscosity of the final composition. While not wishing to be bound by the theory, it is believed that the compatibilizer must be of sufficient length to interact with the functional group on the coating and extend a "tail", which is compatible with the polymeric base, past an outer boundary of the coating and well into the surrounding polymer medium.

In a preferred embodiment of the present invention wherein the polymer base comprises a PDMS fluid with a molecular weight of about 20,000, the molecular weight of the compatibilizer comprises at least about 500, and preferably at least about 1,000. In a more preferred embodiment of the present invention, the molecular weight of the compatibilizer comprises about 5,000 to about 10,000.

In one embodiment of the present invention, the composition comprises 70 to 86 percent by volume filler, including the nanometer and micron sized filler. In another embodiment of the present invention, the polysiloxane fluid comprises about 13 to about 30 percent by volume of the composition. In a further embodiment of the present invention, the compatibilizer comprises about 1 to about 20 percent by volume of the composition, and in a most preferred embodiment of the present invention, the compatibilizer comprises about 2 to about 10 volume percent.

The compositions of the present invention provide the unique ability to achieve a high filler loading while maintaining a low viscosity. This is achieved by adhering to a ratio of micron to nanometer sized particles which produces optimum packing, in conjunction with the coating on the nanometer sized filler and an appropriate compatibilizer.

Thus, in one preferred embodiment of the present invention, the relative volume fractions of large and small particles comprises about 72.7 and about 27.3 volume percent respectively based on the total filler volume. In a still further embodiment of the present invention, the optimum proportion of large sized filler is within approximately 5 volume percent of 72.7 volume percent of the total filler volume, with the balance consisting of small sized particles within approximately 5 volume percent of 27.3 volume percent, based on the total filler volume. In another embodiment of the present invention, the small particles comprise about 15 to about 40 volume percent of the total filler volume. In a further embodiment of the present invention, the total amount of filler in the composite comprises at least about 70 volume percent.

Elliott et al. (J. A. Elliott, A. Kelly, A. H. Windle, *Recursive Packing of Dense Particle Mixtures*, J. Mat. Sci. Ltrs., 21 (2002) 1249-1252) have calculated the theoretically best packing in a recursively packed binary system of spheres to be 85.9 percent by volume. The packing efficiency achieved by the present invention is defined as the actual filler loading divided by the theoretical maximum filler loading. In one embodiment of the present invention, the packing efficiency comprises at least 80%, and in a preferred embodiment of the present invention, the packing efficiency comprises at least 90%.

In an embodiment of the present invention provided as an example of the preparation of a composition of the present invention, composites based on non-reactive polymer matrices are prepared by first mixing the liquid constituents, i.e. compatibilizer and polymer fluid, in a 100 g capacity evacuated Hauschild container at approximately 2000 rpm. The fillers are added next. Nanofillers are mixed first, followed by addition of the micron-sized filler, with mixing between each addition. The target volume of the final mixture is typically 30 cubic centimeters.

In another embodiment of the present invention, composites based on reactive polymer resins are mixed in a similar manner to non-reactive resins, except that the crosslinker was the last ingredient added to the formulation. In the case of platinum-cured silicones, compatibilizer, vinyl-terminated polydimethylsiloxane (polymer base), platinum complex, and the vinylmethyl siloxane homopolymer (moderator) are added first, followed by the nanofiller, micron filler, and lastly the crosslinker, with mixing between each addition. The resulting material it thoroughly degassed under vacuum and subsequently cured within two small jar caps measuring 32 mm in internal diameter and 11 mm in depth. The cure profile comprises heating the samples from room temperature to 150° C. over the course of ~30 minutes followed by an isothermal step at 150° C. for 1 hr.

The combination of coated filler, polymer base, and compatibilizer form the compositions of the present invention. When employed as thermally conductive materials in the microelectronics industry, it is preferred to have viscosities in the uncured state typically comprise less than about 600 Pa·s at room temperature at a shear rate of 10 s−1. In an even more preferred embodiment of the present invention, the viscosity in the uncured state comprises less than about 400 Pa·s at room temperature at a shear rate of 10 s−1. The compositions of the present invention may be employed as uncrosslinked, partially crosslinked, or fully crosslinked systems depending upon the particular application.

EXAMPLES

Example 1

| | | Highly Filled Compositions | | | |
|---|---|---|---|---|---|
| Composition # | Control | 1 | 2 | 3 | 4 |
| Composition by Volume Percent | | | | | |
| Aluminum powder (average particle size = 8.9 microns) | 67.8 | 55.7 | 58.5 | 58.5 | 59.6 |
| Organically coated Aluminum powder (Average particle size = 100 nm) | 0 | 20.9 | 22.0 | 22.0 | 22.4 |
| PDMS fluid (20 cSt) | 22.3 | 16.3 | 14.5 | 10.5 | 12.6 |
| Monocarbinol terminated PDMS (80 cSt; mw = 5000) | 9.9 | 7.0 | 5.0 | 9.0 | 5.4 |
| Total Volume Percent Filler | 67.8 | 76.7 | 80.5 | 80.5 | 82.0 |
| Properties | | | | | |
| Thermal Conductivity[1] (W/m · K) | 2.6 | 4.7 | 5.8 | 6.0 | 6.4 |
| Viscosity[2] at 10 1/s | 147 | 70 | 170 | 250 | 350 |

[1]Thermal conductivity was measured using the Transient Plane Source technique using a Mathis Hotdisk TPS 2500.
[2]Viscosity was measured using an ARES R550PS stress controlled rheometer equipped with a 20 mm parallel plate geometery set at a 0.5 mm gap.

Example 1 illustrates exceptionally improved thermal conductivity in the recursively packed blends while still maintaining preferred viscosities, i.e. about 400 Pa-s or less. Specifically, Composition 4 exhibits about a 2.5 fold higher thermal conductivity than that of the Control composition, which employs particles within a single size range. It is important to emphasize that more efficient packing of the filler particles results in lower viscosity. This effect enables one to increase filler loading and hence increase thermal conductivity, while still maintaining acceptable viscosities, as is seen comparing Composition 1 to Compositions 2 & 3.

Example 2

Example 2 illustrates the effect of the relative amount of 100 nm Al on thermal conductivity and viscosity of PDMS greases. For this example the total filler concentration was held constant at 80.5 volume percent while the relative amounts of nanometer sized aluminum (100 nm) and micron-sized aluminum (8.9 micron) were varied. The organic matrix consisted of 14.5 volume percent PDMS (20 cSt) and the remaining balance monocarbinol terminated PDMS (80 cSt; mw=5000) compatibilizer.

| | Sample ID | | | |
|---|---|---|---|---|
| | 5 | 6 | 7 | 8 |
| Relative Amount of 100 nm aluminum (%) | 20.0 | 27.3 | 32.0 | 40.0 |
| Thermal Conductivity, k (W/m · K) | 4.90 | 5.65 | 5.66 | 5.79 |

-continued

| | Sample ID | | | |
|---|---|---|---|---|
| | 5 | 6 | 7 | 8 |
| Steady Shear Viscosity at 10 s−1 (Pa·s) | NA (solid) | 220 | 195 | 800 |

Figure 2:
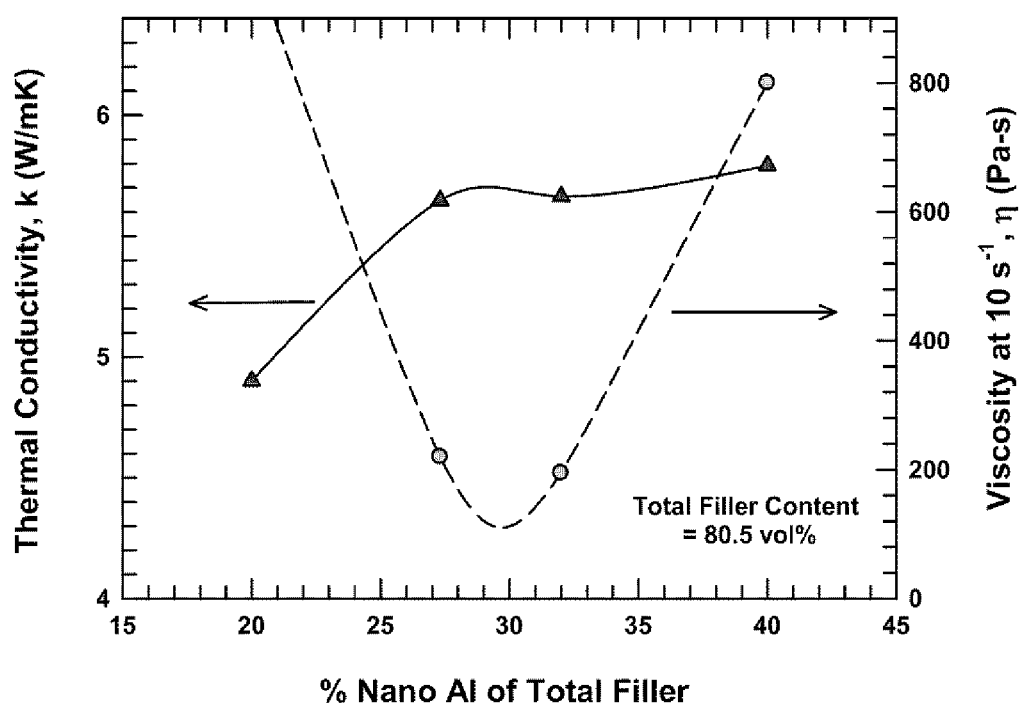
FIG. 2 A plot of thermal conductivity versus percent nanometer sized particle of the total filler content in an embodiment of the present invention.

The results of this example are presented in FIG. 2. There is an expected minimum that occurs in viscosity around the relative theoretical concentration at which recursive packing is predicted to occur. Deviation from the optimum by more than about 5 weight percent nanometer filler leads to highly undesirable viscosity. This is especially important at high total filler loadings. The viscosity of the composition corresponding to 20 weight percent nanometer filler of the total filler was immeasurable given its solid-like properties. Moreover, the poor packing causes air entrapment thereby reducing thermal conductivity.

Example 3

| | Nanofiller used: | | | | |
|---|---|---|---|---|---|
| | ZnO | ZnO | ZnO | ZnO | ZnO |
| Average particle diameter of nanofiller (nm) | 120 | 210 | 330 | 120 | 210 |
| Ratio of average particle diameters of micro to nano | 74 | 42 | 27 | 74 | 42 |
| Nanofiller Coating | None | None | None | Propionic Acid | Propionic Acid |
| Composition (volume percent) | | | | | |
| Micron Sized Aluminum (8.9 micron) | 59 | 59 | 59 | 59 | 59 |
| Nano-sized filler | 22 | 22 | 22 | 22 | 22 |
| PDMS | 13 | 14 | 14 | 13 | 13 |
| Compatibilizer | 6 | 5 | 5 | 6 | 6 |
| Thermal conductivity (W/mK) | 4.54 | 5.145 | 5.61 | 5.08 | 5.03 |
| Viscosity (Pa-s) at 10 s−1 | 394 | 230 | 300 | 118 | 64 |

As demonstrated above, the surface chemistry of the nanometer sized filler makes a huge difference in viscosity. The use of propanoic acid results in nearly 4 fold reduction in 10s−1 reduction in viscosity for the 210 nm ZnO particles (first and last columns), and over a 3 fold reduction for the 120 nm particles ($3^{rd}$ and $4^{th}$ columns) (note the latter comparison is at a different compatibilizer loading). Additionally, comparing the 10 s−1 viscosities for the first three columns (uncoated nanometer ZnO) shows a minimum at intermediate nanometer filler sizes/ratios suggesting a careful balance between surface area and packing.

Example 4

Comparison of nanometer sized zinc oxide and nanometer sized aluminum.

| | Nanofiller used: | | | | |
|---|---|---|---|---|---|
| | Al | Al | Al | ZnO | ZnO |
| Nanofiller Coating | None | Palmatic Acid | Palmatic Acid | None | Propanoic acid |
| Nanofiller Average particle Diameter | 100 | 100 | 100 | 120 | 120 |
| Composition by Volume Percent | | | | | |
| Aluminum powder (APS = 8.9 nm) | 56 | 56 | 59 | 59 | 59 |
| nano-powder (APS = 100 nm) | 21 | 21 | 22 | 22 | 22 |
| PDMS fluid (20 cSt) | 19 | 19 | 13 | 13 | 13 |
| Monocarbinol terminated PDMS (85 cSt; mw = 5,000) | — | — | 6 | 6 | 6 |

-continued

| | Nanofiller used: | | | | |
|---|---|---|---|---|---|
| | Al | Al | Al | ZnO | ZnO |
| Monocarbinol terminated PDMS (250 cSt; mw = 10,000) | 4 | 4 | — | — | — |
| Total Volume Percent Filler | 76.7 | 76.7 | 80.5 | 80.5 | 80.7 |
| Properties | | | | | |
| Thermal Conductivity (W/mK) | 4.3 | 4.5 | 5.7 | 5.1 | 4.5 |
| Visc. 10 1/s | 160 | 73 | 180 | 394 | 118 |

The $3^{rd}$ and $5^{th}$ columns show that using nanometer sized Al leads to significantly higher thermal conductive and some sacrifice in viscosity. This is likely due to the higher inherent thermal conductivity of Al versus ZnO. Moreover, the higher viscosity may reflect the smaller particle size of the nanometer sized Al.

It is further demonstrated that carboxcylic acid coatings in conjunction with moncarbinol compatibilizers leads to greatly reduced viscosity regardless of the nanometer filler type.

Example 5

Carbinol-based compatibilizer investigations in recursively packed mixtures of nanometer and micro aluminum in PDMS. The PDMS viscosity is 20 cSt. The compatibilizer concentration is 4 volume percent, and the total filler concentration is 76.7 volume percent, of which 27.3 volume percent is nanometer aluminum powder and the balance is micron sized aluminum powder.

| | Thermal Conductivity k (W/m · K) | Viscosity at 10 s$^{-1}$ (Pa-s) |
|---|---|---|
| Mono(hydroxyethoxypropyl) terminated PDMS | | |
| MW ≈ 1000 | 4.88 | 175 |
| MW ≈ 5000 | 4.68 | 75 |
| Hydroxyethoxypropyl terminated PDMS | | |
| MW ≈ 1,000 (Hydroxypropyleneoxypropyl methylsiloxane) - dimethly siloxane Copolymer | 4.81 | NA - solid-like |
| MW ≈ 5,000, 5 mole percent hydroxypropyleneoxypropyle methylsiloxane | 5.20 | NA - solid-like |

Terminating both ends of the PDMS chains with hydroxyethoxypropyl groups had little effect on thermal conductivity, yet the consistency of the composition went from a thick grease, in the case of the mono-terminated version, to a solid malleable clay-like consistency. Interestingly, carbinol groups pendent to the main PDMS chain yielded a slightly higher conductivity than compositions based on the end terminated versions. The viscosity for this material was not needle dispensable, i.e. having a consistency between that of a very thick paste and a malleable clay.

Example 6

Figure 3:
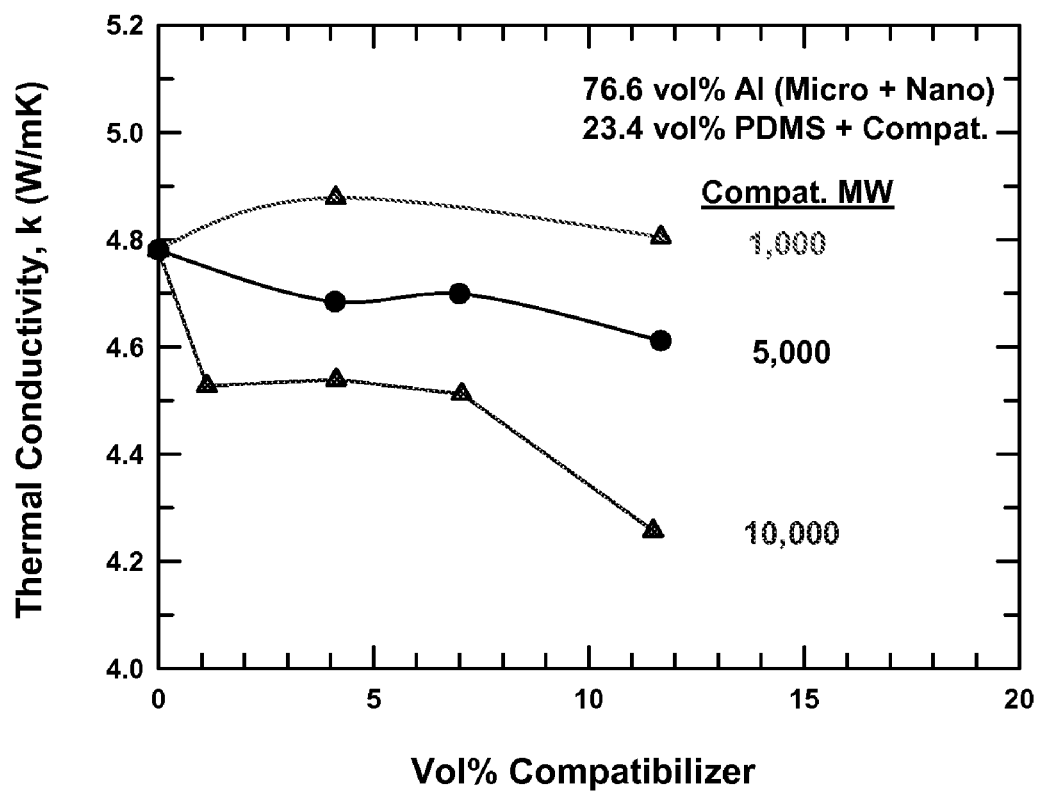
FIG. 3 A plot of thermal conductivity verses volume percent compatibilizer in an embodiment of the present invention.
Figure 4:
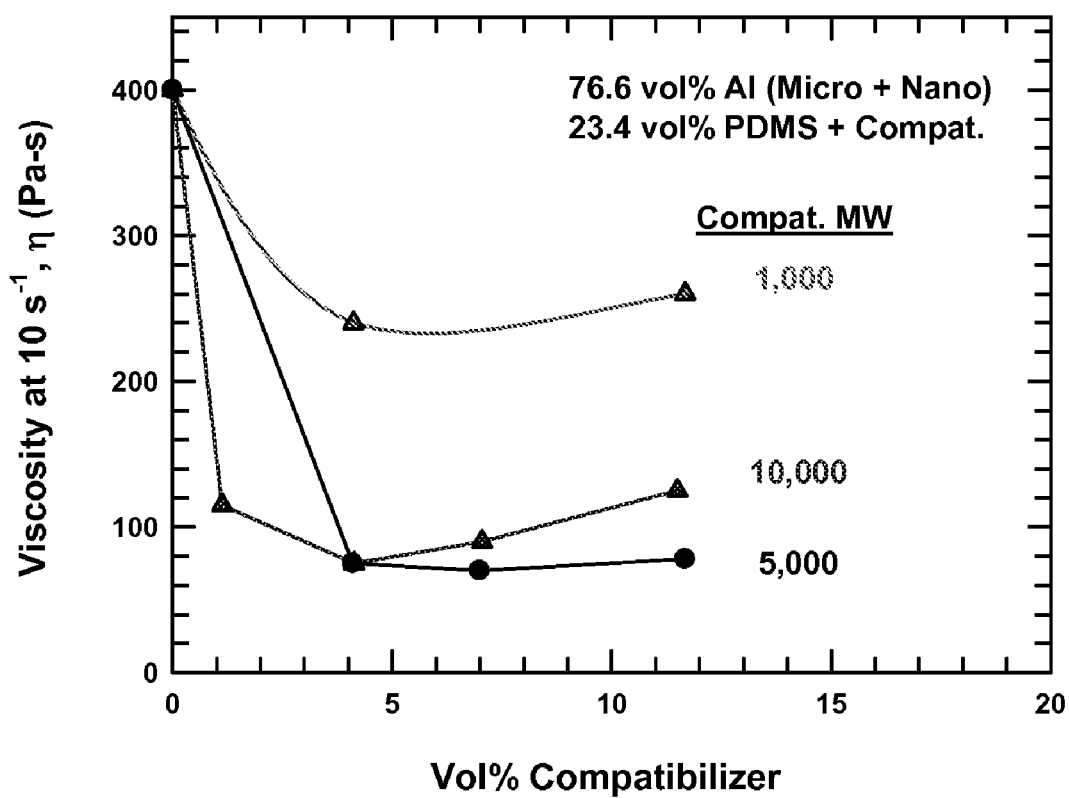
FIG. 4 A plot of viscosity verses volume percent compatibilizer in an embodiment of the present invention illustrating the unexpected reduction in viscosity when using higher molecular weight compatibilizers.

In FIG. 3 and FIG. 4, the molecular weights and viscosities of the pure polymeric constituents are as follows: Base PDMS (MW=2 k, η=20 cSt), LMW compatibilizer (MW=1,000, η=20 cSt), MMW compatibilizer (MW=5,000, η=85 cSt), and HMW compatibilizer (MW=10,000, η=250 cSt).

The lowest molecular weight compatibilizer examined showed little effect on thermal conductivity with respect to concentration, as seen in the first Figure. On the other hand, higher molecular weight compatibilizers cause a slight lowering of the conductivity with increasing concentration. This was unexpected as generally when the molecular weight of one component is increased, the total viscosity of the composition increases.

In the case of viscosity, the HMW compatibilizer and MMW compatibilizer exhibited similar behavior with a large initial reduction viscosity followed by a leveling effect with increasing compatibilizer concentration, as seen in the second Figure. These results were unexpected given the viscosities of the compatibilizers are 4 and 25 times that of the pure PDMS. Viscosity was also reduced with the addition of the LMW compatibilizer, but the level of reduction is not as pronounced as encountered in MMW compatibilizer and HMW compatibilizer formulations. Overall, the monofuctional MMW compatibilizer offers the best combination of conductivity and viscosity when using recursively packed micron sized Al and palmitic acid coated 100 nm Al.

Example 7

Thermal and rheological properties of cross-linked silicones containing highly packed mixtures of 100 nanometer and 8.9 micron aluminum powders.

| | Reactive | | | Non-Reactive |
|---|---|---|---|---|
| | 9 | 10 | 11 | 12 |
| Resin Used | VT PMDS[1] | VT PMDS | VT PMDS | PDMS - 20 cSt |
| Composition by volume percent | | | | |
| Resin Amount | 33.4 | 15.4 | 15.5 | 16.3 |
| Pt catalyst | 0.08 | 0.04 | 0.04 | — |
| Moderator | 0.03 | 0.02 | 0.02 | — |
| Crosslinker | 1.5 | 0.8 | 0.7 | — |
| Compatibilizer Used | None | MMW PDMS | MAP PDMS[2] | MMW PDSM |

-continued

|  | Reactive | | | Non-Reactive |
| --- | --- | --- | --- | --- |
|  | 9 | 10 | 11 | 12 |
| Compatibilizer Amount | 0 | 7 | 7 | 7 |
| Total Filler Concentration | 65 | 76.7 | 76.7 | 76.7 |
| Thermal Conductivity, k (W/m·K) | 2.92 | 4.87 | 4.58 | 4.7 |
| Precured Steady Shear Viscosity at 10 s$^{-1}$ (Pa·s) | 270 | 255 | NA | 70 |

[1]VT PMDS is a vinyl terminated PDMS with a MW = 9400
[2]methacryloxypropyl terminated PDMS The maximum filler loading achieved while still maintaining adequate rheology for a recursively packed system of micron sized Al and palmitic acid coated 100 nm Al was approximately 65 volume percent aluminum (see composition 9). Replacing a portion of the V200 resin with a corresponding amount of monocarbinol terminated PDMS compatibilizer (MMW) afforded the ability to increase filler content and subsequently thermal conductivity, while maintaining comparable viscosity (see composition 10). Using a reactive compatibilizer of the same molecular weight as the non-reactive MMW compatibilizer, namely a methacryloxypropyl terminated PDMS (MAP-PDMS), gave comparable viscosity, yet a lower thermal conductivity (see composition 10 vs. 11). The last column allows for the comparison for a non-reactive system (composition 12) versus a reactive one (composition 10). The non-reactive composite has considerably lower viscosity which is largely the reflection of a lower viscosity resin used.

Although the present invention has been described with reference to particular embodiments, it should be recognized that these embodiments are merely illustrative of the principles of the present invention. Those of ordinary skill in the art will appreciate that the compositions, apparatus and methods of the present invention may be constructed and implemented in other ways and embodiments. Accordingly, the description herein should not be read as limiting the present invention, as other embodiments also fall within the scope of the present invention as defined by the appended claims.

What is claimed is:

1. A composition comprising:
   a polymer base comprising at least one of an epoxy or a polysiloxane fluid;
   at least 70 volume percent of a filler comprising a mixture of micron sized particles and nanometer sized particles, the filler exhibiting a packing efficiency of at least 80%, and said filler coated with a functional coating comprising an unsaturated or saturated fatty acid; and,
   a compatibilizer comprising a monofunctional polydimethylsiloxane which is soluble in the polymer base and comprising at least one functional moiety which interacts with the functional coating on the filler to enhance the affinity between the filler and the polymer base.

2. The composition of claim 1, wherein the viscosity is less than 600 Pa-s at room temperature and a shear rate of 10 s−1.

3. The composition of claim 1, wherein the packing efficiency is at least 90%.

4. The composition of claim 1, wherein the polymer base comprises epoxy.

5. The composition of claim 1, wherein the polymer base comprises reactive monomers.

6. The composition of claim 1, wherein the polymer base comprises a polysiloxane fluid.

7. The composition of claim 6, wherein the polysiloxane fluid comprises polydimethylsiloxane.

8. The composition of claim 1, wherein the functional coating comprises a stearic acid coating.

9. The composition of claim 1, wherein the compatibilizer comprises monocarbinol terminated polydimethylsiloxane.

10. The composition of claim 1, wherein the compatibilizer comprises a molecular weight of at least about 1000.

11. The composition of claim 1, wherein the compatibilizer comprises a functionalized polymer comprising a molecular weight of between about 5,000 and about 10,000.

12. The composition of claim 1, wherein at least one of the nanometer sized particles and the micron sized particles are thermally conductive.

13. The composition of claim 1, wherein at least one of the nanometer sized particles and the micron sized particles are electrically conductive.

14. The composition of claim 1, wherein the nanometer sized particles comprises at least one of aluminum and zinc oxide.

15. The composition of claim 1, wherein the micron sized particles comprises at least one of aluminum or zinc oxide.

16. The composition of claim 1, wherein the micron sized particles have an average particle diameter of 1 to 20 microns.

17. The composition of claim 1, wherein the micron sized particles have an average particle diameter of about 9 microns.

18. The composition of claim 1, wherein the nanometer sized particles have an average particle diameter of 1 to 200 nanometers.

19. The composition of claim 1, wherein the nanometer sized particles have an average particle diameter of about 100 nanometers.

20. The composition of claim 1, wherein the ratio of average particle diameter of the first group of particles to the average particle diameter of the second group of particles is at least 70:1.

21. A method for forming a highly filled thermally conductive composition comprising:
   selecting a thermally conductive filler;
   coating the filler with a functional coating comprising an unsaturated or saturated fatty acid;
   selecting a base fluid comprising at least one of a polymeric base or reactive monomers, said fluid comprising at least one of an epoxy or a polysiloxane fluid;
   selecting a compatibilizer comprising a monofunctional polydimethylsiloxane which is soluble in the polymer base and comprising at least one functional moiety which interacts with the functional coating on the filler; and,
   adding the coated filler and the compatibilizer to the polymer base to achieve a total filler loading of at least 70 volume percent and a viscosity of less than 600 Pa-s at room temperature and a shear rate of 10 s−1.

22. The method of claim 21, wherein the polymer base comprises polydimethylsiloxane.

23. The method of claim 21, wherein the functional coating comprises a stearic acid coating.

24. The method of claim 21, wherein the compatibilizer comprises monocarbinol terminated polydimethylsiloxane.

25. The method of claim 21, wherein the compatibilizer comprises a molecular weight of at least about 1000.

* * * * *